United States Patent
Lee

(10) Patent No.: US 7,932,758 B2
(45) Date of Patent: Apr. 26, 2011

(54) DELAY LOCKED LOOP CIRCUIT AND OPERATION METHOD THEREOF

(75) Inventor: Hye-Young Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/431,227

(22) Filed: Apr. 28, 2009

(65) Prior Publication Data

US 2010/0141312 A1    Jun. 10, 2010

(30) Foreign Application Priority Data

Dec. 5, 2008  (KR) .................. 10-2008-0123477

(51) Int. Cl.
    *H03L 7/06* (2006.01)
(52) U.S. Cl. ........................... 327/158; 327/149
(58) Field of Classification Search .................. 327/149, 327/158
    See application file for complete search history.

(56) References Cited

U.S. PATENT DOCUMENTS

| | | | | |
|---|---|---|---|---|
| 6,525,581 B1 * | 2/2003 | Choi | | 327/175 |
| 6,853,225 B2 * | 2/2005 | Lee | | 327/158 |
| 6,963,235 B2 * | 11/2005 | Lee | | 327/158 |
| 7,282,978 B2 * | 10/2007 | Lee | | 327/175 |
| 7,358,784 B2 * | 4/2008 | Kim et al. | | 327/158 |
| 7,363,563 B1 * | 4/2008 | Hissen et al. | | 714/733 |
| 7,428,286 B2 * | 9/2008 | Kim | | 375/371 |
| 7,560,963 B2 * | 7/2009 | Yun et al. | | 327/158 |
| 7,609,583 B2 * | 10/2009 | Booth et al. | | 365/233.1 |
| 7,612,620 B2 * | 11/2009 | Rausch et al. | | 331/45 |
| 7,629,829 B2 * | 12/2009 | Lee | | 327/298 |
| 7,733,141 B2 * | 6/2010 | Oh | | 327/158 |
| 2007/0069781 A1 * | 3/2007 | Kim et al. | | 327/158 |
| 2007/0194821 A1 * | 8/2007 | Gomm et al. | | 327/158 |
| 2008/0042705 A1 * | 2/2008 | Kim et al. | | 327/158 |
| 2009/0002042 A1 * | 1/2009 | Rausch et al. | | 327/175 |
| 2009/0231006 A1 * | 9/2009 | Jang et al. | | 327/175 |
| 2009/0273380 A1 * | 11/2009 | Shim et al. | | 327/158 |
| 2010/0045353 A1 * | 2/2010 | Booth et al. | | 327/175 |
| 2010/0079182 A1 * | 4/2010 | Lien et al. | | 327/175 |

(Continued)

FOREIGN PATENT DOCUMENTS

KR    1020030016281    2/2003

(Continued)

OTHER PUBLICATIONS

Notice of Allowance issued from Korean Intellectual Property Office on Feb. 21, 2011.

*Primary Examiner* — Lincoln Donovan
*Assistant Examiner* — Adam D Houston
(74) *Attorney, Agent, or Firm* — IP & T Group LLP

(57) ABSTRACT

A delay locked loop circuit includes a delay replica model unit for reflecting a delay time of an actual output path to a source clock and outputting the reflected source clock as a delay replica clock, a detector for detecting a remaining time after subtracting a time corresponding to a multiple of a clock cycle of the source clock from a time corresponding to a phase difference between the delay replica clock and the source clock, and a delay locking unit for delaying the source clock for a delay time to synchronize a clock generated by delaying the source clock for the detected remaining time of the detector with a phase of the source clock.

10 Claims, 6 Drawing Sheets

U.S. PATENT DOCUMENTS

| | | | |
|---|---|---|---|
| 2010/0097112 A1* | 4/2010 | Panditd et al. | 327/175 |
| 2010/0117702 A1* | 5/2010 | Jang et al. | 327/175 |
| 2010/0156488 A1* | 6/2010 | Kim et al. | 327/158 |
| 2010/0164566 A1* | 7/2010 | Ku | 327/149 |

FOREIGN PATENT DOCUMENTS

| | | |
|---|---|---|
| KR | 1020050039727 | 4/2005 |
| KR | 1020070035923 | 4/2007 |
| KR | 1020070036564 | 4/2007 |

* cited by examiner

DELAY LOCKED LOOP CIRCUIT AND OPERATION METHOD THEREOF

CROSS-REFERENCE TO RELATED APPLICATIONS

The present invention claims priority of Korean patent application number 10-2008-0123477, filed on Dec. 5, 2008, which is incorporated by reference in its entirety.

BACKGROUND OF THE INVENTION

The present invention relates to a semiconductor technology device, and more particularly, to a delay locked loop circuit of a semiconductor device for performing a delay locking operation with a minimum update cycle although a high speed clock signal is applied.

A synchronous semiconductor memory device such as Double Data Rate Synchronous DRAM (DDR SDRAM) uses an internal clock to transmit data to external devices. Here, the internal clock is synchronized with an external clock inputted from an external device such as a memory controller CTRL.

Therefore, it is useful to temporally synchronize the external clock from the memory controller with data from a memory in order to stably transmit data between the memory and the memory controller.

The memory outputs data by synchronizing the data with an internal clock. Although the internal clock is synchronized with an external clock when the internal clock is initially applied to the memory, the internal clock may get delayed while passing through constituent elements in the memory and become dissynchronized when the internal clock is outputted to the outside of the memory.

Therefore, in order to stably transmit data outputted from the memory, it is necessary to synchronize the internal clock with the external clock by compensating for a data loading time of loading data to the internal clock for accurately locating the delayed internal clock at an edge or a center of an external clock from the memory controller.

To perform such an operation, a clock synchronization circuit was introduced. The clock synchronization circuit includes a phase locked loop (PLL) circuit and a delay locked loop (DLL) circuit.

If a frequency of an external clock is different from a frequency of an internal clock, the phase locked loop (PLL) circuit is generally used because it uses a frequency multiplication function to synchronize clocks having different frequencies. However, if a frequency of an external clock is equal to a frequency of an internal clock, the delay locked loop (DLL) is generally used because the delay locked loop (DLL) is not influenced by noise as much as the phase locked loop (PLL) and occupies a smaller area compared to the phase locked loop (PLL).

That is, since a semiconductor memory device uses internal and external clocks having the same frequency, the semiconductor memory device generally includes the delay locked loop (DLL) circuit as a clock synchronization circuit.

FIG. 1 is a block diagram illustrating a delay locked loop circuit according to related art.

Referring to FIG. 1, the delay locked loop (DLL) circuit includes a delay replica model unit 100 for reflecting a delay time of an actual output path to a delay locked clock DLLCLK and outputting the reflected delay locked clock DLLCLK as a feedback clock FBCLK, a phase comparator 120 for comparing a phase of a source clock REFCLK with a phase of the feedback clock FBCLK, and a clock delay unit (140 and 160) for delaying a source clock REFCLK in response to an output signal DECONS of the phase comparator 120 and outputting the delayed source clock REFCLK as a delay locked clock DLLCLK. Also, the delay locked loop circuit further includes a clock buffer unit 180 for buffering a positive clock CLK and a negative clock CLKb and outputting the buffered clock as a source clock REFCLK and a clock driver 190 for driving the delay locked clock DLLCLK as a predetermined driving force.

The clock delay unit includes a delay controller 160 for generating a clock delay control code formed of a plurality of bits in response to a signal DECONS outputted from the phase comparator 120 and a delay 140 for delaying a source clock REFCLK by a delay time decided corresponding to a clock delay control code DECON_CODE<0:N> and outputting the delayed source clock as the delay locked clock DLLCLK.

Although the delay replica model unit 100 was described as reflecting the delay time of the actual output path to the delay locked clock DLLCLK and outputting the reflected clock as the feedback clock FBCLK, the delay time of the actual output path may be decided by modeling the sum of a time taken for transferring the delay locked clock DLLCLK from the delay locked loop circuit to a data output circuit of the semiconductor device and a time for buffering the clock buffering unit 180. Therefore, the delay time of the actual output path defined by the delay replica model unit 100 can be defined in advance when a semiconductor device is designed. After deciding the delay time, the delay time is not changed.

Hereinafter, operation of the delay locked loop DLL circuit according to the related art will be described.

FIGS. 2A and 2B are timing diagrams for describing operation of delay locked loop circuit shown in FIG. 1 and the problem thereof.

Referring to FIGS. 2A and 2B, two timing diagrams of the delay locked loop circuit according to the related art are illustrated for a low frequency source clock REFCLK and a high frequency source clock REFCLK.

Although a reference edge of a source clock REFCLK is not synchronized with that of a feedback clock FBCLK at an initial state of the delay locked loop circuit, the reference edges of the source clock REFCLK and the feedback clock FBCLK are synchronized in FIGS. 2A and 2B. That is, the timing diagram of FIGS. 2A and 2B show states of the clocks after a delay locking operation is complete. Although the reference edge is a rising edge in FIGS. 2A and 2B, the reference edge may be a falling edge.

In more detail, the feedback clock FBCLK is further delayed by at least a delay time D2 of an actual output path with respect to a source clock REFCLK at an initial state of a delay locked loop circuit although it is not shown in FIGS. 2A and 2B. Therefore, the reference edge of the feedback clock FBCLK is behind of the reference edge of the source clock REFCLK.

If the delay locked loop circuit starts a delay locking operation, delay times D1 of the clock delay unit (140 and 160) gradually increase. The delay time D1 is close to '0' at the initial state. Therefore, the delay in feedback clock FBCLK gradually increases. Accordingly, the reference edge of the feedback clock FBCLK is gradually delayed with respect to the reference edge of the source clock REFCLK. However, since the feedback clock FBCLK and the source clock REFCLK have the same frequency, the reference edge of the feedback clock FBCLK and the reference edge of the source clock REFCLK are synchronized at any time point, that is, if the clock delay units 140 and 160 sufficiently delay the feedback clock FBCLK. Although the reference edge of the feedback clock FBCLK is synchronized with a reference edge located one clock tCK behind of the reference of the source clock REFCLK, it is equivalent to a situation where the feedback clock FBCLK and the source clock REFCLK are synchronized without a phase difference because the feedback clock FBCLK and the source clock REFCLK have the same frequency clocks.

If the feedback clock FBCLK and the REFCLK are synchronized through the above described processes, the delay locking operation of the delay locked look circuit ends. Therefore, if the reference edge of the feedback clock is synchronized with the reference edge of the source clock REFCLK as shown, the delay locking operation of the delay locked loop circuit is complete.

In FIGS. 2A and 2B, a reference character D1 denotes a time taken for receiving the source clock REFCLK and outputting the delay locked clock DLLCLK. That is, the reference character D1 represents a time delayed until the source clock REFCLK is outputted as the delay locked clock DLLCLK. Therefore, the time corresponding D1 varies according to the output signal DECONS of the phase comparator 120. In case of a low frequency source clock REFCLK as shown in FIG. 2A, the time D1 is comparatively long. In case of a high frequency source clock REFCLK as shown in FIG. 2B, the time D1 is comparatively short.

A reference character 'D2' denotes a time taken for receiving a delay locked clock DLLCLK at the delay replica model unit 100 and outputting the received delay locked clock DLLCKL as the feedback clock FBCLK. That is, the reference character 'D2' denotes a time delayed until the delay locked clock DLLCLK is outputted as the feedback clock FBCLK. Therefore, the time D2 is always locked regardless of the operation of the delay locked loop circuit. The time D2 is identical in FIG. 2A for the low frequency source clock REFCLK and FIG. 2B for the high frequency source clock REFCLK.

As shown in FIG. 2A for the low frequency source clock REFCLK, a delay time of the delay replica model unit 110 corresponding to the time D2 is shorter than one cycle tCK of the source clock REFCLK. That is, a time taken for receiving the delay locked clock DLLCLK from the delay replica model unit 100 and outputting it as the feedback clock FBCLK is shorter than one cycle tCK of the source clock REFCLK.

Therefore, the sum of the delay time D1 of the delay replica model unit 100 and the delay times D2 of the clock delay unit (140 and 160) become a time corresponding to one cycle tCK of the source clock REFCLK. Accordingly, the source clock REFCLK and the feedback clock FBCLK having the same frequency have a phase difference as much as one clock cycle tCK.

On the contrary, as shown in FIG. 2B for the high frequency source clock REFCLK, the delay time D2 of the delay replica model unit 100 is longer than one cycle tCK of the source clock REFCK because the frequency of the source clock REFCLK is high frequency. That is, a time taken by the delay replica model unit 100 for receiving the delay locked clock DLLCLK and outputting it as the feedback clock FBCLK is longer than one cycle tCK of the source clock REFCLK.

Therefore, the sum of the delay time D1 of the delay replica model unit 100 and the delay times D2 of the clock delay unit (140 and 160) become longer than a time corresponding to one cycle tCK of the source clock REFCLK. Accordingly, the source clock REFCLK and the feedback clock FBCLK having the same frequency may have a phase difference of two cycles 2×tCK of the source clock REFCLK.

However, if a time taken by a delay locked loop circuit to update one time becomes longer than one cycle tCK of the source clock REFCLK because the delay time of the delay replica model unit 100 becomes longer than one cycle tCK of the source clock REFCLK as shown in FIG. 2B for the high frequency of the source clock REFCLK, it may cause a problem that the phase comparator 120 compares a phase with a feedback clock RBCLK which is not completely updated. Therefore, the delay amounts of the clock delay unit (140 and 160) are greatly changed because the completely updated feedback clock FBCLK is not inputted to the phase comparator 120 although the feedback clock FBCLK is completely updated.

Therefore, it is necessary to perform an additional operation for reducing the delay amounts of the clock delay unit (140 and 160) to synchronize a phase of the feedback clock FBCLK with a phase of the source clock REFCLK. As a result, the delay locked loop circuit takes a longer time to operate.

Since such a problem makes the reference edge of the feedback clock RBCLK to fall behind or lead ahead of the reference edge of the source clock REFCLK, jitters of internal clocks increase.

Since a time taken by a delay locked loop circuit to update is always longer than one cycle tCK of the source clock REFCLK, the time of toggling the source clock until the delay locking operation ends significantly increases. It is because the update of the delay locked loop circuit repeats several times through the delay locking operation.

The delay locking operation of the delay locked loop circuit according to an exemplary embodiment ends before the source clock REFCLK is toggled several times. Therefore, it may be difficult to complete the delay locking operation within a desired value because the toggling time of the source clock REFCLK increases until the delay locking operation completely ends.

The above mentioned problems may occur more frequently if the delay locked loop circuit receives high frequency external clocks CLK and CLKB. Lately, a semiconductor device is generally designed to use high frequency external clocks CLK and CLKB. Therefore, the above mentioned problems may occur frequently in semiconductor devices.

SUMMARY OF THE INVENTION

Exemplary embodiments of the present invention are directed to providing a semiconductor device that performs a delay locking operation with an update cycle locked to one clock cycle 1tCK although a high speed clock signal is applied.

In accordance with an exemplary aspect of the present invention, there is provided A delay locked loop circuit includes a delay replica model unit for reflecting a delay time of an actual output path to a source clock and outputting the reflected source clock as a delay replica clock, a detector for detecting a remaining time after subtracting a time corresponding to a multiple of a clock cycle of the source clock from a time corresponding to a phase difference between the delay replica clock and the source clock, and a delay locking unit for delaying the source clock by a delay time to synchronize a clock generated by delaying the source clock by the detected time of the detector with a phase of the source clock.

In accordance with another exemplary aspect of the present invention, there is provided a delay locked loop circuit including a delay locking unit for delaying a source clock by a delay time necessary to synchronize a phase of the source clock with a phase of a feedback clock for locking a delay and outputting the delayed source clock as a delay locked clock, a delay replica model unit for reflecting a delay time of an actual output path to the delay locked clock and outputting the reflected clock as a delay replica clock, a detector for detecting a remaining time after subtracting a time corresponding to a multiple of the delay locked clock cycle from a time corresponding to a phase difference of the delay replica clock and the delay locked clock, and a clock delay unit for delaying a phase of the delay locked clock by the detected time of the detector and outputting the delayed clock as the feedback clock In accordance with still another exemplary aspect of the present invention, there is provided a delay locked loop circuit including a first phase comparator for comparing a phase of a source clock with a phase of a first feedback clock, a first clock delay unit for delaying a phase of the source clock in response to an output signal of the first phase comparator and outputting the delayed source clock as a delay locked clock, a delay replica model unit for reflecting a delay time of an actual output path to the source clock and outputting the reflected source clock as a delay replica clock, a second phase compactor for comparing a phase of the delay replica clock with a phase of a second feedback clock, a second clock delay unit for delaying a phase of the delay locked clock in response to an output signal of the second phase comparator and outputting the delayed delay locked clock as the first feedback clock, and a third clock delay unit for delaying a phase of the source clock in response to an output signal of the second phase comparator and outputting the delayed source clock as the second feedback clock.

In accordance with a further exemplary aspect of the present invention, there is provided a delay locked loop circuit comprising a first phase comparator for comparing a phase of a source clock with a phase of a feedback clock, a first clock delay unit for delaying a phase of the source clock in response to an output signal of the first phase comparator and outputting the delayed source clock as a delay locked clock, a delay replica model unit for reflecting a delay time of an actual output path to the delay locked clock and outputting the reflected delay locked clock as a delay replica clock, a second phase comparator for comparing a phase of the delay replica clock with a phase of the feedback clock, and a second clock delay unit for delaying a phase of the delay locked clock in response to an output signal of the second phase comparator as the feedback clock.

In accordance with yet another exemplary aspect of the present invention, there is provided an operating method of a delay locked loop circuit, including detecting a phase difference between a reference edge of a source clock and a reference edge of a clock generated by reflecting a delay time of an actual output path to the source clock, and outputting a delay locked clock by delaying the source clock by a delay time necessary to synchronize a phase of the source clock with a phase of a clock delayed corresponding to an output signal of said detecting a phase difference.

In accordance with yet another exemplary aspect of the present invention, there is provided an operation method of a delay locked loop circuit, including delaying a source clock by a delay time necessary to synchronize a phase of a source clock with a phase of a feedback clock for locking a delay and outputting the delayed source clock as a delay locked clock, detecting a phase difference between a reference edge of a clock generated by reflecting a delay time of an actual output path to the delay locked clock with a reference edge of the feedback clock, and delaying a phase of the delay locked clock according to an output signal generated from said detecting a phase difference and outputting the delay locked clock with the phase delayed as the feedback clock.

DESCRIPTION OF SPECIFIC EMBODIMENTS

Other objects and advantages of the present invention can be understood by the following description, and become apparent with reference to the following embodiments of the present invention.

First Embodiment

Figure 1:
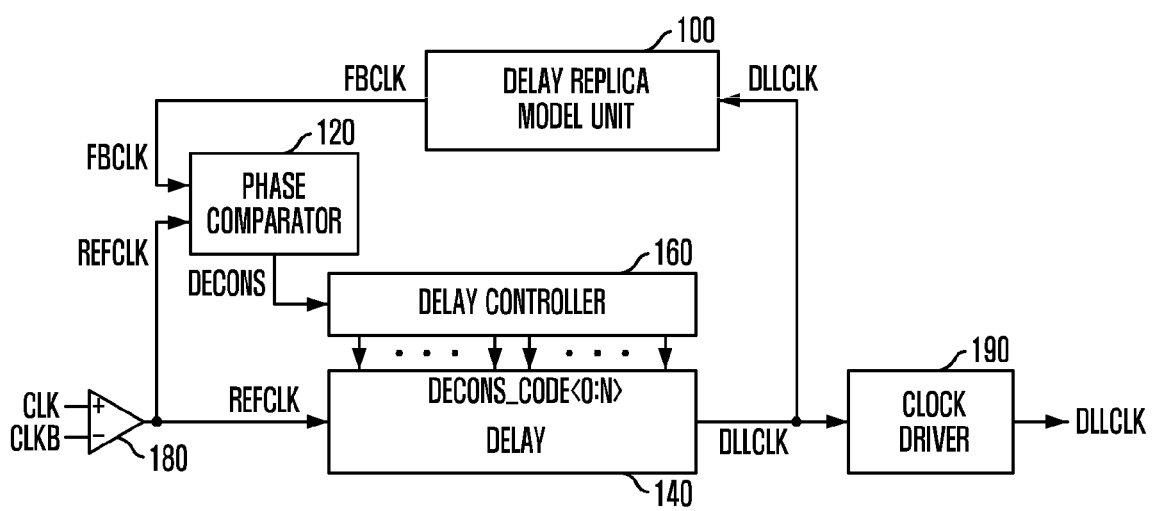
FIG. 1 is a block diagram illustrating a delay locked loop circuit according to the related art.
Figure 2A:
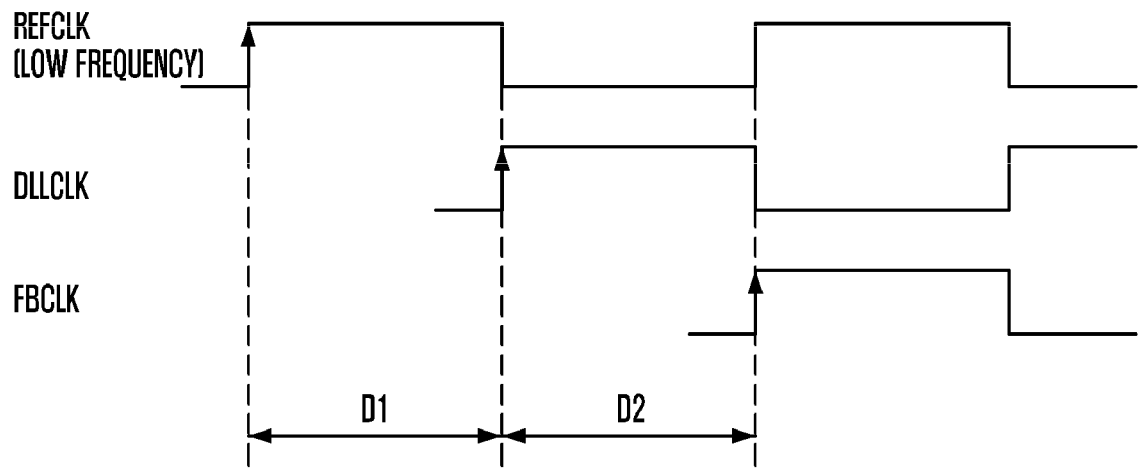
FIGS. 2A and 2B are timing diagrams for describing operation of a delay locked loop circuit of FIG. 1 and problems thereof.
Figure 2B:
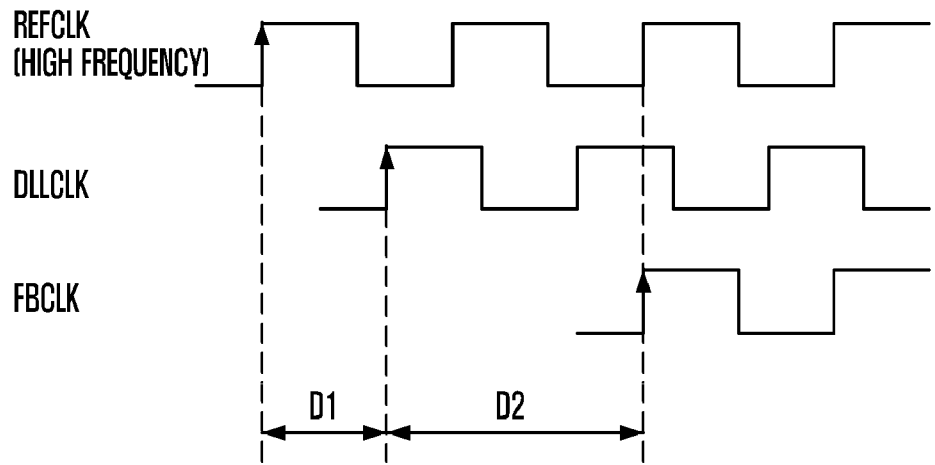
Figure 3:
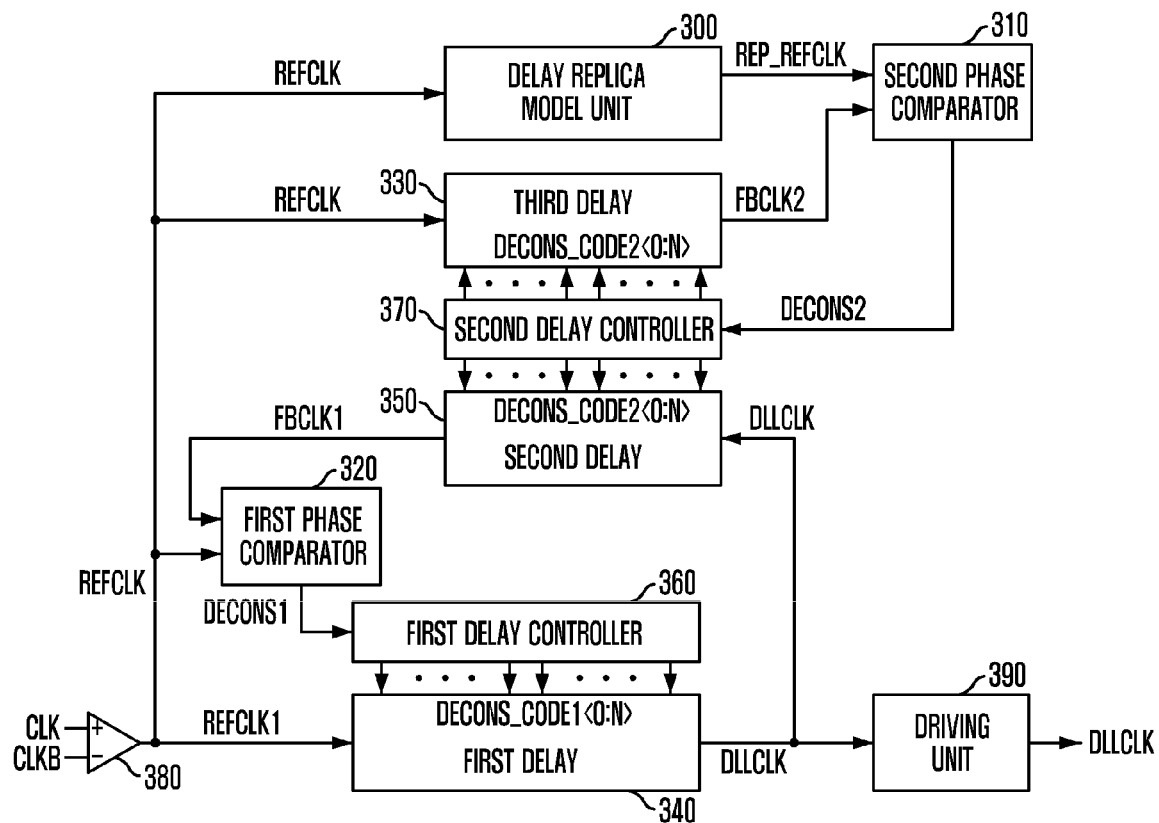
FIG. 3 is a block diagram illustrating a delay locked loop circuit in accordance with a first embodiment of the present invention.

FIG. 3 is a block diagram illustrating a delay locked loop circuit in accordance with a first embodiment of the present invention.

Referring FIG. 3, a delay locked loop (DLL) circuit according to the first embodiment of the present invention includes constituent elements 300, 310, 330, 350, and 370 for detecting a phase difference between a reference edge of a clock REP_REFCLK generated by reflecting a delay time of an actual output path to a source clock REFCLK with a reference edge of a source clock REFCLK and constituent elements 320, 340, and 360 for delaying the source clock REFCLK as long as a delay time necessary to synchronize a phase of the source clock REFCLK with a clock FBCLK1 generated by delaying the source clock REFCLK as long as a delay time detected in the constituent elements 300, 310, 330, and 370, and outputting the delayed source clock REFCLK as a delay locked clock DLLCLK. Although a rising edge is used as the reference edge in the present embodiment, a falling edge can be used as the reference edge.

In more detail, the delay locked loop circuit according to the first embodiment includes a delay replica model unit 300 for reflecting a delay time of an actual output path to the source clock REFCLK and outputting the reflected clock as a delay replica clock REP_REFCLK, a detector (310, 330, 350, and 370) for detecting a remaining time after subtracting a time (n*tCK) corresponding to a multiple of one cycle 1tCK of the source clock REFCLK from a time corresponding to a phase difference of the delay replica clock REP_REFCLK and the source clock REFCLK, and a delay locking unit (320, 340 and 360) for delaying the source clock REFCLK by a delay time necessary to synchronize a phase of the source clock REFCLK with a phase of a clock FBCLK1 generated by delaying the source clock REFCLK by the detected time from the detector (310, 330, 350, and 370). Here, 'n' denotes an integer number, and the time (n*tCK) is a time smaller than one cycle 1tCK of the source clock REFCLK.

That is, the delay locked loop circuit according to the first embodiment includes a first phase comparator 320 for comparing a phase of the source clock REFCLK with a phase of a first feedback clock FBCLK1, a first clock delay unit (340 and 360) for delaying the phase of the source clock REFCLK in response to an output signal DECONS1 of the first phase comparator 320 and outputting the delayed source clock REFCLK as a delay locked clock DLLCLK, a delay replica model unit 300 for reflecting a delay time of an actual output path to the source clock REFCLK and outputting the reflected clock as the delay replica clock REP_REFCLK, a second phase comparator for comparing a phase of the delay replica clock REP_REFCLK with a phase of a second feedback clock FBCLK2, a second clock delay unit (350 and 370) for delaying a phase of the delay locked clock DLLCLK in response to an output signal DECONS2 of the second phase comparator 310 and outputting the delayed clock as a first feedback clock FBCLK1, and a third clock delay unit (330 and 370) for delaying a phase of the source clock REFCLK in response to an output signal DECONS2 of the second phase comparator 310 and outputting the delayed clock as a second feedback clock FBCLK2. The delay locked loop circuit according to the first embodiment further includes a clock buffer unit 380 for buffering a positive clock CLK and a negative clock CLKb inputted from the outside and outputting the buffered clock as the source clock REFCLK, and a clock driving unit 390 for driving the delay locked clock DLLCLK with a predetermined driving force.

The first clock delay unit includes a first delay controller 360 for generating a first clock delay control code DECON_CODE1<0:N> formed of a plurality of bits in response to a signal DECONS1 outputted from the first phase comparator 320, and a first delay 340 for delaying the source clock REFCLK by a delay time corresponding to the first clock delay control code DECON_CODE1<0:N> and outputting the delayed clock as the delay locked clock DLLCLK.

The second clock delay unit includes a second delay controller 370 for generating a second clock delay control code DECON_CODE2<0:N> formed of a plurality of bits in response to a signal DECONS2 outputted from the second phase comparator 310, and a second delay 350 for delaying the delay locked clock DLLCLK by a delay time corresponding to the second clock delay control code DECON_CODE2<0:N> and outputting the delayed clock as a first feedback clock FBCLK1.

The third clock delay unit includes second delay controller 370 for generating a second clock delay control code DECON_CODE2<0:N> formed of a plurality of bits in response to a signal DECONS2 outputted from the second phase comparator 310, and a third delay 330 for delaying the source clock REFCLK by a delay time corresponding to the second clock delay control code DECON_CODE2<0:N> and outputting the delayed clock as a second feedback clock FBCLK2.

Here, the second clock delay unit (350 and 370) and the third clock delay unit (330 and 370) share the second delay controller 370 because the second clock delay unit (350 and 370) and the third clock delay unit (330 and 370) operate in response to the same signal, that is, the output signal DECONS2 from the second phase comparator 310. It means that the second clock delay unit (350 and 370) and the third clock delay unit (330 and 370) delay an input signal with the same delay time although the second clock delay unit (350 and 370) and the third clock delay unit (330 and 370) receive and output different signals. As described above, the third clock delay unit (330 and 370) receives the source clock REFCLK and output the second feedback clock FBCLK2, and the second clock delay unit (350 and 370) receives the delay locked signal DLLCLK and outputs the first feedback clock FBCLK1.

As described above, the delay replica model unit 300 outputs the delay replica clock REP_REFCLK by reflecting the delay time of the actual output path to the source clock REFCLK. The delay time of the actual output path is decided by modeling the sum of a time taken for transferring the delay locked clock DLLCLK outputted from the delay locked loop circuit to a data output circuit in a semiconductor device and a time for buffering data in the clock buffer unit 380. Therefore, the delay time of the actual output path defined in the delay replica model 300 can be determined in advance when a semiconductor device is designed. That is, the delay time of the actual output path is not changed after the determination.

Hereinafter, operation of the delay locked loop circuit according to the first embodiment will be described in detail.

Figure 4:
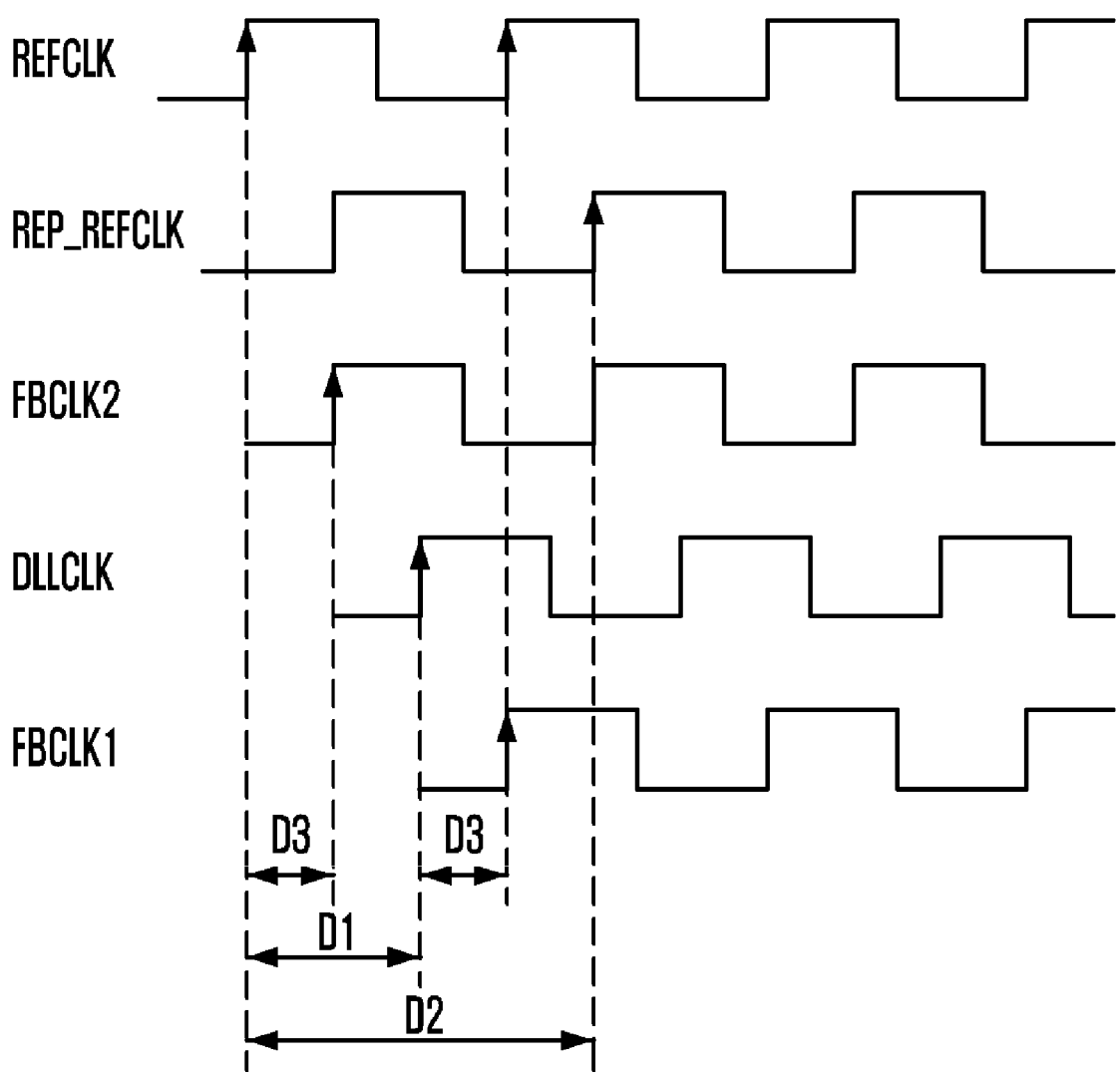
FIG. 4 is a timing diagram for describing operation of a delay locked loop circuit of FIG. 3.

FIG. 4 is a timing diagram for describing operation of a delay locked loop circuit of FIG. 3.

Referring to FIG. 4, the timing diagram illustrates signals after the delay locked loop (DLL) circuit performs a delay locking operation according to the first embodiment. That is, the timing diagram shows a reference edge of the first feedback clock FBCLK1 is synchronized with a reference edge of the source clock REFCLK, which was not synchronized at an initial state of the delay locked loop circuit. Here, a rising edge is used as the reference edge in FIG. 4. However, a falling edge may be used as the reference edge.

In more detail, at the initial state of the delay locked loop circuit according to the first embodiment, the delay replica clock REP_REFCLK is further delayed with respect to the source clock REFCLK by the delay time of the actual output path by the delay replica model unit 300. Here, the delay time is equivalent to a time D2. The second feedback clock FBCLK2 is further delayed by an initial delay time of the third delay unit 330 with respect to the source clock REFCLK by the third clock delay unit (330 and 370). Here, the initial delay time is close to 0. The delay locked clock DLLCLK is further delayed by an initial delay time of the first delay unit 340 with respect the source clock REFCLK by the first clock delay unit (340 and 360). Here, the initial delay time is close to 0. The first feedback clock FBCLK1 is further delayed by an initial delay time of the second delay unit 350 with respect to the delay locked clock DLLCLK by the second clock delay unit (350 and 370). Here, the initial delay time is close to 0 and identical to the initial delay time of the third delay unit 330.

Under this condition, the second phase compactor 310 operates before the first phase comparator 320 operates. As a result, the delay amount of the third clock delay unit (330 and 370) for synchronizing the delay replica clock REP_REFCLK and the second feedback clock FBCLK2, which have a phase difference equal to the delay time of the actual output path, is gradually increased. Thus, a reference edge of the second feedback clock FBCLK2 is gradually shifted backward with respect to a reference edge of the source clock REFCLK.

Here, the second phase comparator 310 determines that the delay replica clock REP_REFCLK is synchronized with the second feedback clock FBCLK2 when the reference edge of the delay replica clock REP_REFCLK is synchronized with the reference edge of the second feedback clock FBCKL2. Since the delay replica clock REP_REFCLK and the second feedback clock FBCLK2 have the same frequency, the reference edge of the second feedback clock FBCLK2 becomes synchronized with the reference edge of the delay replica clock REP_REFCLK at a moment when the delay amount of the third clock delay unit (330 and 370) is increased sufficiently. Although the reference edge of the second feedback clock FBCLK2 is synchronized with a reference edge that is located one clock cycle tCK ahead of the reference of the delay replica clock REP_REFCLK used as a comparison reference at the initial state, it is equivalent to a situation where the second feedback clock FBCLK2 and the delay replica clock REP_REFCLK are synchronized exactly because the second feedback clock FBCLK2 and the delay replica clock REP_REFCLK have the same frequency.

Therefore, the reference edge of the second feedback FBCLK2 does not further shift backward than the reference edge of the source clock REFCLK as long as the reference edge of the delay replica clock REP_REFCLK which further shifts backward than the reference edge of the source clock REFCLK. That is, the reference edge of the second feedback clock FBCLK2 shifts backward within a smaller range than a time corresponding to one cycle 1tCK of the source clock.

Therefore, a delay time of the third delay 330 becomes a remaining time after subtracting a time (n*tCK, where n is an integer number) corresponding to a multiple of one cycle 1tCK of the source clock REFCLK from a delay time of the delay replica model unit 300. The remaining time is shorter than one cycle 1tCK of the source clock and is equivalent to a time D3.

For reference, it is assumed that the delay time of the actual output path in the delay replica model unit 300 is longer than a time corresponding to one cycle 1tCK of the source clock REFCLK. If the delay time of the actual output path in the delay replica model unit 300 is shorter than a time corresponding to one cycle 1tCK of the source clock REFCLK, the delay time of the third delay 330 may be identical to the delay time of the delay replica model unit 300.

If the delay time of the third delay 330 is decided through the above mentioned processes, that is, if the phase of the delay replica clock REP_REFCLK is synchronized with a phase of the second feedback clock FBCLK2, the first phase comparator 320 starts operating. At this moment, the second clock delay unit (350 and 370) and the third clock delay unit (330 and 370) have the same initial delay amount, and the delay amounts thereof gradually increases to a delay amount corresponding to the output signal DECOND2 from the second comparator 310. Therefore, the second delay 350 and the third delay 330 output delayed signals by delaying an input signal with the same delay time.

Therefore, the reference edge of the first feedback clock FBCLK1 further shifts backward with respect to the reference edge of the source clock REFCLK by increasing the delay amount of the first clock delay unit (340 and 360) for synchronizing the source clock REFCLK and the first feedback clock FBCLK1, which has a phase difference corresponding to a delay time of the second delay 350.

The first phase comparator 320 determines that the source clock REFCLK is synchronized with the first feedback clock FBCLK1 when the reference edge of the source clock REFCLK is synchronized with the reference edge of the first feedback clock FBCLK1. Since the source clock REFCLK and the first feedback clock FBCLK1 have the same frequency, the reference edge of the first feedback clock FBCLK1 is synchronized with the reference edge of the source clock REFCLK when the sum of the delay time of the first clock delay unit (340 and 360) and the delay time of the second clock delay unit (350 and 370) becomes equal to a time corresponding to one cycle 1tCK of the source clock REFCLK. Although the reference edge of the first feedback clock FBCLK1 is synchronized with a reference edge located one clock cycle tCK behind of the reference clock of the source clock which was a comparison reference at the initial state, it is equivalent to that the first feedback clock FBCLK1 is synchronized with the source clock REFCLK because the first feedback clock FBCLK1 and the source clock REFCLK have the same frequency.

Therefore, the delay time of the first delay 340 becomes equal to a remaining time after subtracting the delay time of the second delay 350 from a time corresponding to one cycle 1tCK of the source clock REFCLK. The remaining time is equivalent to a time D1.

If the first feedback clock FBCLK1 is synchronized with the source clock REFCLK, the delay locked loop circuit according to the first embodiment completes the delay locking operation. As shown, the synchronization of the reference edges of the feedback clock FBCLK and the source clock REFCLK means completion of the delay locking operation of the delay locked loop circuit.

As described above, the delay locked loop circuit according to the first embodiment can sustain an update time of the delay locking operation within one cycle 1tCK of the source clock by controlling the delay time of the second delay 350 to be equal to the remaining time after subtracting a time (n*tCK, where n is an integer number) corresponding to a multiple of one cycle 1tCK of the source clock REFCLK from the delay time of the delay replica model unit 300. Here, the update time is a time taken by the source clock REFCLK to pass through the first clock delay unit (340 and 360), the second clock delay unit (350 and 370), and the first phase comparator 320.

As described above, although a delay time of an actual output path in the delay replica model unit 300 is longer than a time corresponding to one cycle 1tCK of the source clock REFCLK due to the source clock REFCLK toggling to a high frequency, it is controlled to only apply a remaining time after subtracting a time (n*tCK, where n is an integer) corresponding to a multiple of one cycle 1tCK of the source clock REFCLK to the delay locking operation by applying the first embodiment of the present invention. Therefore, the update cycle of the delay locking operation can be fixed to one cycle 1tCK of the clock signal.

Second Embodiment

Figure 5:
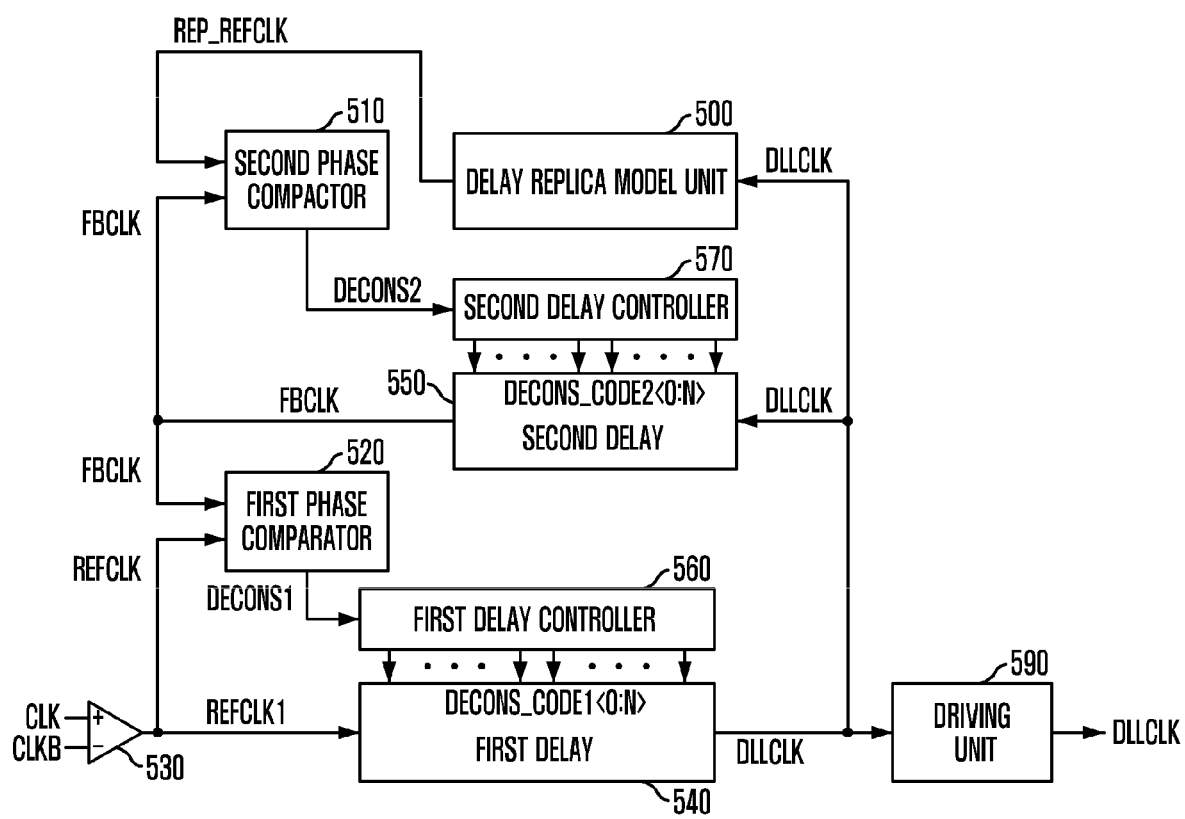
FIG. 5 is a block diagram illustrating a delay locked loop circuit in accordance with a second embodiment of the present invention.

FIG. 5 is a block diagram illustrating a delay locked loop circuit in accordance with a second embodiment of the present invention.

Referring to FIG. 5, the delay locked loop (DLL) circuit according to the second embodiment includes constituent elements 520, 540, and 560 for delaying a source clock REFCLK by a delay time necessary for synchronizing a phase of a source clock REFCLK for locking a delay with a phase of a feedback clock FBCLK, constituent elements for detecting a phase difference between a reference edge of a clock REP_DLLCLK generated by reflecting a delay time of an actual output path to a delay locked clock DLLCLK and a reference edge of a feedback clock FBCLK, and constituent elements 550 and 570 for delaying a phase of the delay locked clock DLLCKL by a time corresponding to the detected phase difference and outputting the delayed clock as the feedback clock FBCLK. Here, a rising edge is used as the reference edge. However, a falling edge may be used as the reference edge.

In more detail, the delay locked loop circuit according to the second embodiment includes a delay locking unit (520, 540, and 560) for delaying a source clock REFCLK by a delay time necessary for synchronizing a phase of a source clock REFCLK for locking a delay with a phase of a feedback clock FBCLK and outputting the delayed clock as a delay locked clock DLLCLK, a delay replica model unit 500 for reflecting a delay time of an actual output path to the delay locked clock DLLCLK and outputting the reflected clock as a delay replica clock REP_DLLCLK, a detector 510 for detecting a remaining time after subtracting a time (n*tCK, where n is an integer number) corresponding to a multiple of one cycle 1tCK of the delay locked clock DLLCLK from a time corresponding to a phase difference of the delay replica clock REP_DLLCLK and the delay locked clock DLLCLK, and a clock delay unit (550 and 570) for delaying the phase of the delay locked clock DLLCLK by the detected time from the detector 510 as the feedback clock FBCLK. Here, the delay locked clock DLLCLK and the source clock REFCLK have the same frequency, the remaining time is shorter than one cycle 1tCK of the source clock REFCLK.

That is, the delay locked loop circuit according to the second embodiment includes a first phase comparator 520 for comparing a phase of the source clock REFCLK with a phase of the feedback clock FBCLK, a first clock delay unit (540 and 560) for delaying a phase of the source clock REFCLK in response to an output signal DECONS1 of the first phase comparator 520 and outputting the delayed clock as the delay locked clock DLLCLK, a delay replica model unit 500 for reflecting a delay time of an actual output path to the delay locked clock DLLCLK and outputting the reflected clock as a delay replica clock REF_DLLCLK, a second phase comparator 510 for comparing a phase of the delay replica clock REP_DLLCLK with a phase of the feedback clock FBCLK, and a second clock delay unit (530 and 570) for delaying a phase of the delay locked clock DLLCLK in response to an output signal DECONS2 of the second phase comparator 510 and outputting the delayed clock as a feedback clock FBCLK.

The delay locked loop circuit according to the second embodiment further includes a clock buffer unit 580 for buffering a positive clock CLK and a negative clock CLKb from the outside and outputting the buffered clock as the source clock REFCLK and a clock driving unit 590 for driving the delay locked clock DLLCLK with a predetermined driving force.

The first clock delay unit includes a first delay controller 560 for generating a first clock delay control code DECON_CODE1<0:N> formed of a plurality of bits in response to a signal DECONS1 outputted from the first phase comparator 520 and a first delay 540 for delaying the source clock REFCLK by a delay time corresponding to the first clock delay control code DECON_CODE1<0:N> and outputting the delayed clock as a delay locked clock DLLCLK.

The second clock delay unit includes a second delay controller 570 for generating a second clock delay control code DECON_CODE2<0:N> formed of a plurality of bits in response to a signal DECONS2 outputted from the second phase comparator 510, and a second delay 550 for delaying the delay locked clock DLLCLK by a delay time corresponding to the second clock delay control code DECON_CODE2<0:N>.

The delay replica model unit 500 reflects the delay time of the actual output path to the delay locked clock DLLCLK and outputs the reflected clock as the delay replica clock REP_DLLCLK. Here, the delay time of the actual output path can be decided by modeling the sum of a time taken by the delay locked clock from the delay locked loop circuit to a data output circuit in a semiconductor device and a time for buffering data in the clock buffer unit 580. Therefore, the delay time of the actual output path defined in the delay replica model unit 500 can be defined in advance with the semiconductor device designed. The delay time is not changed after it decides.

Hereinafter, operation of the delay locked loop circuit according to the second embodiment will be described.

Figure 6:
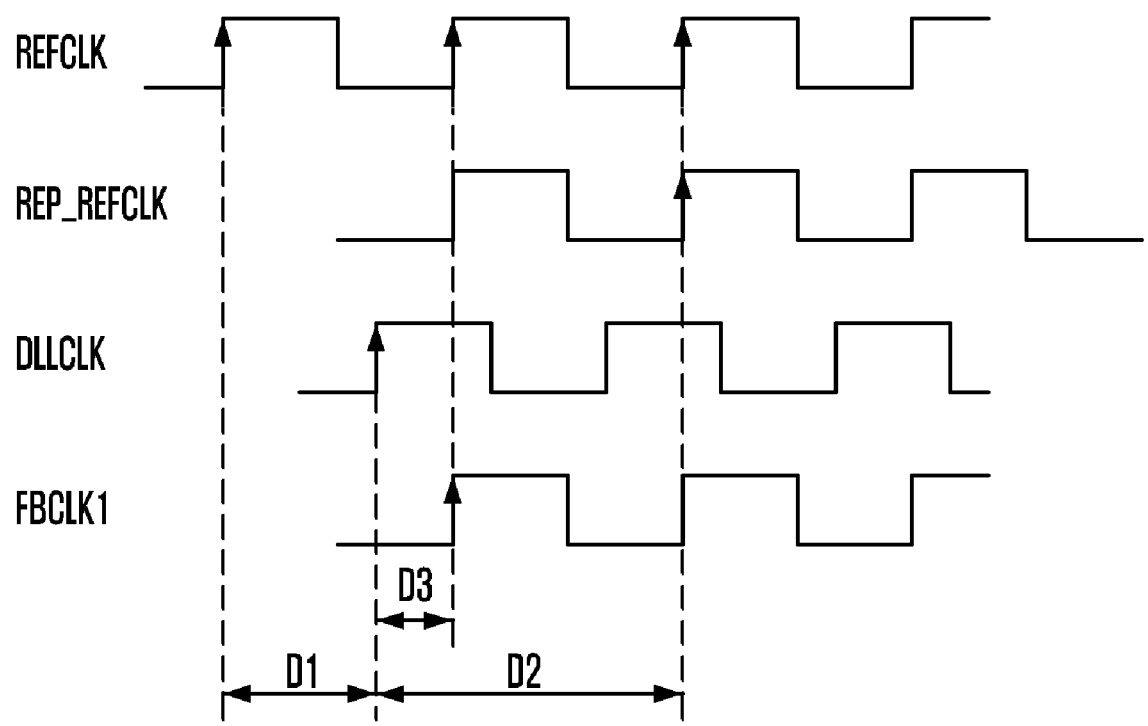
FIG. 6 is a timing diagram for describing operation of a delay locked loop circuit of FIG. 5.

FIG. 6 is a timing diagram for describing operation of a delay locked loop circuit of FIG. 5 according to the second embodiment.

Referring to FIG. 6, the timing diagram illustrates signals after the delay locked loop (DLL) circuit performs a delay locking operation according to the second embodiment. That is, the timing diagram shows a reference edge of the feedback clock FBCLK is synchronized with a reference edge of the source clock REFCLK, which was not synchronized at an initial state of the delay locked loop circuit. Here, a rising edge is described as the reference edge in FIG. 6. However, a falling edge may be used as the reference edge.

At an initial state of the delay locked loop circuit, the delay locked clock DLLCLK is further delayed by the first clock delay unit (540 and 560) by an initial delay time of the first delay 540 with respect to the source clock REFCLK. Here, the initial delay time is close to 0. Also, at the initial state, the delay replica clock REP_DLLCLK is further delayed by the delay time of the actual output path by the delay replica model unit 500 with respect to the delay locked clock DLLCLK. Here, the delay time of the actual output path is equivalent to a time D2. Furthermore, at the initial state, the feedback clock FBCLK is further delayed by the second clock delay unit (550 and 570) by an initial delay time of the second delay unit 550 with respect to the delay locked clock DLLCLK. Here, the initial delay time of the second delay unit 550 is close to 0. Therefore, the source clock REFCLK, the delay locked clock DLLCLK, and the feedback clock FBCLK have almost same phase at the initial state of the delay locked loop circuit, and the delay replica clock REP_DLLCLK is further delayed by the delay time of the actual output path with respect to the source clock REFCLK and the delay locked clock DLLCLK. The delay time is equivalent to the time D2.

Under this state, the second phase comparator 510 starts to operate before the first phase comparator 520. Accordingly, the delay amount of the second clock delay unit (550 and 570) gradually increases for synchronizing the delay replica clock REP_DLLCLK and the feedback clock FBCLK, which have a maximum phase difference equal to the delay time of the actual output path. As a result, the reference edge of the feedback clock FBCLK further shifts backward than the reference edge of the delay locked clock DLLCLK.

Here, the second phase comparator 510 determines that the delay replica clock REP_DLLCLK is synchronized with the feedback clock FBCLK when the reference edge of the delay replica clock REP_DLLCLK is synchronized with the reference edge of the feedback clock FBCLK. Since the delay replica clock REP_DLLCLK and the feedback clock FBCLK have the same frequency, the reference edge of the feedback clock FBCLK is synchronized with the reference edge of the delay replica clock REP_DLLCLK when the delay amount of the second clock delay unit (550 and 570) increases sufficiently. Although the reference of the feedback clock FBCLK is synchronized with a reference edge located one clock tCK ahead of the reference edge of the delay replica clock REP_DLLCLK which was a comparison reference at the initial state, it is equivalent to that the feedback clock FBCLK is synchronized with the delay replica clock REP_DLLCLK because the feedback clock FBCLK and the delay replica clock REP_DLLCLK have the same frequency.

Therefore, the reference edge of the feedback clock FBCLK does not further shift backward than the reference edge of the delay locked clock DLLCLK as much as the reference edge of the delay replica clock REP_DLLCLK that further shifts backward than the reference edge of the delay locked clock DLLCLK. That is, the reference edge of the feedback clock FBCLK further shifts backward than the reference edge of the delay locked clock within a smaller range than a time corresponding to one cycle 1tCK of the delay locked clock DLLCLK. At this moment, it may be equivalent to that the reference edge of the feedback clock FBCLK further shifts backward than the reference edge of the delay locked clock DLLCLK within a smaller time range than a time corresponding to one cycle 1tCK of the source clock REFCLK because the delay locked clock DLLCLK and the source clock REFCLK have the same frequency.

Therefore, the delay time of the second delay 550 becomes a remaining time after subtracting a time (n*tCK, where n is an integer number) corresponding to a multiple of one cycle 1tCK of the source clock REFCLK from the delay time of the delay replica model unit 500. The remaining time is equivalent to a time D3.

For reference, under this condition, it is assumed that the delay time of the actual output path in the delay replica model unit 500 is longer than a time corresponding to one cycle 1tCK of the source clock REFCLK. If the time corresponding to the one cycle 1tCK of the source clock REFCLK is shorter than the delay time of the actual output path in the delay replica model unit 500, the delay time of the second delay 550 becomes identical to the delay time of the delay replica model unit 500.

If the second delay 550 decides the delay time thereof through the above mentioned processes, that is, if the phase of the delay replica clock REP_DLLCLK is synchronized with the phase of the feedback clock FBCLK, the first phase comparator 520 starts operating.

As a result, the reference edge of the feedback clock FBCLK further shifts backward than the reference edge of the source clock by gradually increasing the delay amount of the first clock delay unit (540 and 560) for synchronizing the source clock REFCLK and the feedback clock FBCLK, which had a phase difference as much as a delay time of the second delay 550.

At this moment, the first phase comparator 520 determines that the source clock REFCLK is synchronized with the feedback clock FBCLK when the reference edge of the source clock REFCLK is synchronized with the reference edge of the feedback clock FBCLK. Since the source clock REFCLK and the feedback clock FBCLK have the same frequency, the reference edge of the feedback clock FBCLK is synchronized with the reference edge of the source clock REFCLK if the sum of the delay time of the first clock delay unit (540 and 560) and the delay time of the second clock delay unit (550 and 570) becomes identical to a time corresponding to one cycle 1tCK of the source clock REFCLK. Although the reference edge of the feedback clock FBCLK is synchronized with a reference edge located one cycle tCK behind of the reference edge of the source clock REFCLK which was a comparison reference at the initial state, it is equivalent to that the feedback clock FBCLK is synchronized with the source clock REFCLK because the feedback clock FBCLK and the source clock REFCLK have the same frequency.

Therefore, the delay time of the first delay 540 in the first clock delay unit becomes a remaining time after subtracting a delay time of the second delay 550 from a time corresponding to one cycle 1tCK of the source clock REFCLK. The remaining time is equivalent to a time D1.

If the feedback clock FBCLK is synchronized with the source clock REFCLK through the above mentioned processes, it means that the delay locked loop circuit completes the delay locking operation. That is, a synchronization state of the reference edge of the feedback clock FBCLK and the reference edge of the source clock REFCLK means a completion state of the delay locking operation of the delay locked loop circuit according to the second embodiment.

Also, an update time of the delay locking operation can be sustained within one cycle 1tCK of the source clock REFCLK by controlling a remaining time after subtracting a time (n*tCK, where n is an integer) corresponding to a multiple of one cycle 1tCK of the source clock REFCLK from the delay time of the delay replica model unit 500 to be equal to the delay time of the second delay 550 in the second clock delay unit. Here, the update time is a time taken by the source clock to pass through the first clock delay unit (540 and 560), the second clock delay unit (550 and 570), and the first phase comparator 520.

As described above, the delay locked loop circuit according to the second embodiment can control the update cycle of the delay locking operation to be fixed to one cycle 1tCK of a clock signal by controlling the delay locking operation to be applied only at a remaining time after subtracting a time (n*tCK, where n is an integer) corresponding to a multiple of one cycle 1tCK of the source clock REFCLK from the delay time of the delay replica model unit 500 although the delay time of the actual output path of the delay replica model unit 500 is longer than a time corresponding to one cycle 1tCK of the source clock REFCLK due to the source clock REFCLK toggling to a high frequency.

While the present invention has been described with respect to the specific embodiments, it will be apparent to those skilled in the art that various changes and modifications may be made without departing from the spirit and scope of the invention as defined in the following claims.

The delay time of the delay replica model unit 300 or 500 was described to be longer than a time corresponding to one cycle 1tCK of the source clock REFCLK and shorter than two cycles 2tCK. However, the embodiments of the present invention may be applied identically although the delay time of the delay replica model unit 300 or 500 is longer than a time corresponding to one cycle 1tCK of the source clock.

Embodiments of the present invention relate to a delay locked loop circuit and an operating method thereof. The delay locked loop circuit according to the embodiments of the present invention can control an update cycle of a delay locking operation to be fixed at one cycle 1tCK of a clock signal by applying a delay locking operation only to a part of a delay time of the delay replica model unit shorter than one cycle 1tCK of a clock signal although the delay time of the delay replica model unit is longer than one cycle 1tCK of the clock signal because a high speed clock signal is applied.

Therefore, a delay locking operation can be performed using a minimum update time although a high speed clock signal is provided to the delay locked loop circuit.

What is claimed is:

1. A delay locked loop circuit comprising:
   a delay replica model unit for delaying a source clock by a predetermined delay time to generate a delay replica clock;
   a detector for detecting a remaining time after subtracting a time corresponding to a multiple of a clock cycle of the source clock from a time corresponding to a phase difference between the delay replica clock and the source clock; and
   a delay locking unit for delaying the source clock for a delay time necessary to synchronize a clock generated by delaying the source clock for the detected remaining time of the detector with a phase of the source clock.

2. The delay locked loop circuit of claim 1, wherein the detector is configured to detect a time to delay the source clock to synchronize a reference edge of the source clock with a reference edge of the delay replica clock.

3. The delay locked loop circuit of claim 1, wherein the delay locking unit includes:
- a first clock delay unit for delaying a phase of the source clock in response to a first delay control signal and outputting the delayed source clock as a delay locked clock;
- a second clock delay unit for delaying a phase of the delay locked clock in response to a second delay control signal and outputting the delayed delay locked clock as a feedback clock; and
- a first phase comparator for comparing a phase of the source clock with a phase of the feedback clock and deciding a value of the first delay control signal in response to a comparison result.

4. The delay locked loop circuit of claim 3, wherein the detector includes:
- a third clock delay unit for delaying a phase of the source clock in response to the second delay control signal; and
- a second phase comparator for comparing a phase of the delay replica clock with a phase of a clock outputted from the third delay unit and deciding a value of the second delay control signal in response to a comparison result.

5. The delay locked loop circuit of claim 1, wherein the delay locked loop circuit further includes:
- a clock buffering unit for buffering a clock applied from an external device and outputting the buffered clock as the source clock; and
- a clock driving unit for driving a delay locked clock with a predetermined driving force.

6. A delay locked loop circuit, comprising:
- a first phase comparator for comparing a phase of a source clock with a phase of a first feedback clock;
- a first clock delay unit for delaying a phase of the source clock in response to an output signal of the first phase comparator and outputting the delayed source clock as a delay locked clock;
- a delay replica model unit for delaying a source clock by a predetermined delay time to generate a delay replica clock;
- a second phase comparator for comparing a phase of the delay replica clock with a phase of a second feedback clock;
- a second clock delay unit for delaying a phase of the delay locked clock in response to an output signal of the second phase comparator and outputting the delayed delay locked clock as the first feedback clock; and
- a third clock delay unit for delaying a phase of the source clock in response to an output signal of the second phase comparator and outputting the delayed source clock as the second feedback clock.

7. The delay locked loop circuit of claim 6, wherein a time of delaying a phase of the delay locked clock in the second clock delay unit is equal to a time of delaying a phase of the source clock in the third clock delay unit.

8. The delay locked loop circuit of claim 6, wherein the time of delaying a phase of the delay locked clock in the second clock delay unit and the time of delaying a phase of the source clock in the third clock delay unit is shorter than a time corresponding to one cycle of the source clock.

9. The delay locked loop circuit of claim 6, wherein the predetermined delay time is a delay time of an actual output path and is shorter than the time of delaying a phase of the delay locked clock in the second clock delay unit and the time of delaying a phase of the source clock in the third clock delay unit.

10. The delay locked loop circuit of claim 6, further comprising:
- a clock buffering unit for buffering a clock applied from an external device and outputting the buffered clock as the source clock; and
- a clock driving unit for driving the delay locked clock with a predetermined driving force.

* * * * *